United States Patent
Lee et al.

(10) Patent No.: US 9,171,781 B2
(45) Date of Patent: Oct. 27, 2015

(54) SEMICONDUCTOR DEVICES AND METHODS OF FABRICATING THE SAME

(71) Applicant: Samsung Electronics Co., Ltd., Suwon-Si, Gyeonggi-Do (KR)

(72) Inventors: Jang-Hee Lee, Yongin-si (KR); Jongmin Baek, Suwon-si (KR); Kyu-Hee Han, Hwaseong-si (KR); Gilheyun Choi, Seoul (KR); Jongwon Hong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/134,043

(22) Filed: Dec. 19, 2013

(65) Prior Publication Data
US 2014/0225251 A1     Aug. 14, 2014

(30) Foreign Application Priority Data

Feb. 13, 2013   (KR) .......................... 10-2013-0015297

(51) Int. Cl.
| | |
|---|---|
| *H01L 23/48* | (2006.01) |
| *H01L 21/764* | (2006.01) |
| *H01L 23/482* | (2006.01) |
| *H01L 23/522* | (2006.01) |
| *H01L 21/768* | (2006.01) |
| *H01L 23/28* | (2006.01) |

(52) U.S. Cl.
CPC .......... *H01L 23/4821* (2013.01); *H01L 21/764* (2013.01); *H01L 21/7682* (2013.01); *H01L 21/76834* (2013.01); *H01L 23/28* (2013.01); *H01L 23/48* (2013.01); *H01L 23/5222* (2013.01); *H01L 2924/0002* (2013.01)

(58) Field of Classification Search
CPC ... H01L 23/28; H01L 21/764; H01L 23/4821; H01L 23/48; H01L 21/7682; H01L 21/76834
See application file for complete search history.

(56) References Cited

U.S. PATENT DOCUMENTS

| | | | | |
|---|---|---|---|---|
| 6,214,719 | B1 * | 4/2001 | Nag ............................... | 438/619 |
| 6,242,336 | B1 * | 6/2001 | Ueda et al. ..................... | 438/619 |
| 6,303,487 | B1 * | 10/2001 | Kagamihara ................. | 438/619 |
| 6,399,476 | B2 * | 6/2002 | Kim et al. ..................... | 438/619 |
| 7,091,611 | B2 * | 8/2006 | Ahn et al. ..................... | 257/758 |
| 7,132,306 | B1 * | 11/2006 | Rhee et al. ..................... | 438/42 |
| 7,619,310 | B2 * | 11/2009 | Huebinger et al. ........... | 257/758 |
| 7,682,904 | B2 | 3/2010 | Kim et al. | |
| 7,790,601 | B1 | 9/2010 | Choi et al. | |

(Continued)

FOREIGN PATENT DOCUMENTS

| | | |
|---|---|---|
| JP | 2004-363516 A | 12/2004 |
| JP | 2007-188911 A | 7/2007 |

(Continued)

*Primary Examiner* — Michele Fan
(74) *Attorney, Agent, or Firm* — Harness, Dickey & Pierce, P.L.C.

(57) ABSTRACT

Semiconductor devices, and methods of fabricating the same, include first conductive lines on a substrate, and a first molding layer covering the first conductive lines. The first conductive lines have air gaps between adjacent first conductive lines. Sidewalls of the first conductive lines and a bottom surface of the first molding layer collectively define a first gap region of each of the air gaps. The sidewalls of the first conductive lines and a top surface of the first molding layer collectively define a second air gap region of each of the air gaps.

9 Claims, 24 Drawing Sheets

(56) References Cited

U.S. PATENT DOCUMENTS

| | | | |
|---|---|---|---|
| 8,310,053 B2* | 11/2012 | Verheijden et al. | 257/758 |
| 2002/0005584 A1* | 1/2002 | Domae | 257/758 |
| 2002/0060354 A1* | 5/2002 | Nakagawa et al. | 257/618 |
| 2003/0077893 A1* | 4/2003 | Demolliens et al. | 438/622 |
| 2004/0056359 A1* | 3/2004 | Lee et al. | 257/758 |
| 2004/0097065 A1* | 5/2004 | Lur et al. | 438/619 |
| 2004/0119134 A1* | 6/2004 | Goldberg et al. | 257/508 |
| 2004/0121577 A1* | 6/2004 | Yu et al. | 438/622 |
| 2005/0277284 A1* | 12/2005 | Iguchi | 438/619 |
| 2007/0052101 A1* | 3/2007 | Usami | 257/758 |
| 2007/0063256 A1* | 3/2007 | Imai et al. | 257/315 |
| 2007/0178713 A1* | 8/2007 | Jeng | 438/787 |
| 2008/0153252 A1* | 6/2008 | Liu et al. | 438/421 |
| 2008/0185722 A1* | 8/2008 | Liu et al. | 257/751 |
| 2008/0299758 A1* | 12/2008 | Harada et al. | 438/619 |
| 2009/0023279 A1 | 1/2009 | Kim et al. | |
| 2009/0093100 A1* | 4/2009 | Xia et al. | 438/421 |
| 2009/0121313 A1* | 5/2009 | Hashimoto | 257/522 |
| 2009/0166881 A1* | 7/2009 | Balakrishnan et al. | 257/774 |
| 2009/0302367 A1* | 12/2009 | Nagano | 257/316 |
| 2010/0078746 A1* | 4/2010 | Jung | 257/432 |
| 2010/0090346 A1* | 4/2010 | Torres et al. | 257/773 |
| 2010/0093168 A1* | 4/2010 | Naik | 438/618 |
| 2010/0130001 A1* | 5/2010 | Noguchi | 438/627 |
| 2010/0270677 A1* | 10/2010 | Usami | 257/773 |
| 2011/0021036 A1* | 1/2011 | Braecklmann et al. | 438/763 |
| 2011/0183516 A1* | 7/2011 | Lee | 438/653 |
| 2011/0318914 A1* | 12/2011 | Choi et al. | 438/587 |
| 2012/0032344 A1* | 2/2012 | Usami | 257/774 |
| 2012/0058639 A1* | 3/2012 | Sim et al. | 438/666 |
| 2012/0070976 A1* | 3/2012 | Kim et al. | 438/594 |
| 2012/0074484 A1* | 3/2012 | Kang et al. | 257/316 |
| 2012/0199938 A1* | 8/2012 | Hwang et al. | 257/506 |
| 2012/0241981 A1* | 9/2012 | Hirano | 257/777 |
| 2013/0020706 A1* | 1/2013 | Furuhashi et al. | 257/741 |
| 2013/0134496 A1* | 5/2013 | Ahn et al. | 257/321 |
| 2013/0207267 A1* | 8/2013 | Rho, II | 257/751 |
| 2013/0214413 A1* | 8/2013 | Lee et al. | 257/741 |
| 2014/0035147 A1* | 2/2014 | Lee | 257/762 |
| 2014/0084384 A1* | 3/2014 | Choi et al. | 257/401 |
| 2014/0220754 A1* | 8/2014 | Min | 438/287 |

FOREIGN PATENT DOCUMENTS

| | | |
|---|---|---|
| JP | 2008-010534 A | 1/2008 |
| JP | 2012-049290 A | 3/2012 |
| KR | 10-2004-0093565 A | 11/2004 |
| KR | 10-2006-0114181 A | 11/2006 |

* cited by examiner

SEMICONDUCTOR DEVICES AND METHODS OF FABRICATING THE SAME

CROSS-REFERENCE TO RELATED APPLICATIONS

This U.S. non-provisional patent application claims the benefit of priority under 35 U.S.C. §119 to Korean Patent Application No. 10-2013-0015297, filed on Feb. 13, 2013, the entirety of which is incorporated by reference herein.

BACKGROUND

1. Field

Example embodiments of the inventive concepts relate to semiconductor devices and/or methods of fabricating the same, more particularly, to semiconductor devices including wire-structures and/or methods of fabricating the same.

2. Discussion of Related Art

Semiconductor devices are widely used in the electronic industry because of their small size, multi-function, and/or low fabrication costs. The semiconductor devices may be categorized as any one of semiconductor memory devices storing logic data, semiconductor logic devices processing operations of logical data, and hybrid semiconductor devices having both the function of the semiconductor memory devices and the function of the semiconductor logic devices.

High speed and/or low voltage semiconductor devices have been demanded with high speed operation and low power consumption of electronic devices including semiconductor devices. The semiconductor devices have been highly integrated in order to satisfy the above demands. As an integration density of the semiconductor device increases, reliability of the semiconductor device may be deteriorated. However, semiconductor devices having high reliability have been increasingly demanded with the development of the electronic industry. Thus, various researches are being conducted in order to improve the reliability of the semiconductor devices.

SUMMARY

Example embodiments of the inventive concepts may provide semiconductor devices having high reliability and/or methods of fabricating the same.

Example embodiments of the inventive concepts may also provide highly integrated semiconductor devices and/or methods of fabricating the same.

According to an example embodiment, a semiconductor device may include first conductive lines on a substrate, and a first molding layer covering the first conductive lines. The first conductive lines have air gaps between adjacent first conductive lines. Sidewalls of the first conductive lines and a bottom surface of the first molding layer collectively define a first gap region of each of the air gaps. The sidewalls of the first conductive lines and a top surface of the first molding layer collectively define a second gap region of each of the air gaps.

In some example embodiments, the first molding layer may extend between the first conductive lines; and the first gap region may be separated from the second gap region by the first molding layer.

In some example embodiments, the semiconductor device may further include a capping layer on the first molding layer; and second conductive lines on the capping layer.

In some example embodiments, the capping layer may extend between the first conductive lines; and the first gap region may be separated from the second gap region by the capping layer and the first molding layer.

In some example embodiments, the second gap region may be between the capping layer and the first molding layer.

In some example embodiments, the semiconductor device may further a second molding layer between the capping layer and the second gap region.

In some example embodiments, the second gap region may extend between the second conductive lines.

In some example embodiments, the semiconductor device may further include a second molding layer covering the second conductive lines. The second conductive lines may extend between the second conductive lines. The second gap region may be further defined by sidewalls of the second conductive lines and a bottom surface of the second molding layer.

In some example embodiments, a height difference may occur between the bottom surface of the first molding layer and top surfaces of the first conductive lines; and the height difference may have a range of about 20% to about 80% of a height of the first conductive lines.

In another example embodiment, a method of fabricating a semiconductor device may include forming first conductive lines on a substrate; forming a first sacrificial layer filling a region between the first conductive lines; removing an upper portion of the first sacrificial layer to form a recess region between the first conductive lines; forming a first molding layer covering the first conductive lines and the recess region; and removing the first sacrificial layer to form first air gaps.

In some example embodiments, the forming a first molding layer may include forming the first molding layer partially extended onto sidewalls of the first conductive lines. A portion of the sidewalls of the first conductive lines may define the recess region.

In some example embodiments, the method may further include forming a capping layer on the first molding layer; forming second conductive lines on the capping layer; forming a second sacrificial layer between the second conductive lines; forming a second molding layer covering the second conductive lines and the second sacrificial layer, the second molding layer extending between the second conductive lines; and removing the second sacrificial layer to form second air gaps between the second conductive lines.

In some example embodiments, the capping layer and the second sacrificial layer may extend into the recess region; and the removing the second sacrificial layer to form second air gaps includes forming the second air gaps extending between the first conductive lines.

In some example embodiments, the method may further include, before forming the capping layer, forming a third sacrificial pattern filling the recess region on the first molding layer; forming a third molding layer on the third sacrificial pattern; and removing the third sacrificial pattern to form third air gaps between the third molding layer and the first molding layer.

In some example embodiments, the removing the first sacrificial layer may include performing one selected from an ashing process and an ultraviolet irradiating process.

According to a further example embodiment, a semiconductor device includes first conductive lines separated from each other by first gaps containing a first gaseous medium, and a first molding layer covering an upper surface of the first conductive lines. The first gaps are adjacent to a lowermost portion of the first conductive lines. The first molding layer defines either an upper surface of the first gaps or a bottom surface of the first gaps.

The first gaseous medium may have a dielectric constant lower than a dielectric constant of silicon oxide.

The semiconductor device may include second conductive lines respectively over the first conductive lines, and a second molding layer covering an upper surface of the second conductive lines, the second molding layer defining an upper surface of the second gaps. The second conductive lines may be separated from each other by second gaps containing a second gaseous medium. The second gaps may be adjacent to a lowermost portion of the second conductive lines, The first molding layer may be one of (i) interposed between the first gaps and the second gaps, and (ii) defines the bottom surface of the first gaps. If the first molding layer defines the bottom surface of the first gaps, then the first gaps may be respectively integral with the second gaps, and the second gaps may be adjacent to the lowermost portion of the second conductive lines and an uppermost portion of the first conductive lines.

The first gaps may be respectively integral with the second gaps, and the first gaseous medium may be different than the second gaseous medium.

The first molding layer may be interposed between the first gaps and the second gaps, and the first gaseous medium may be different than the second gaseous medium.

The first gaps may be respectively integral with the second gaps, and the first gaseous medium may be the same as the second gaseous medium.

The first molding layer may be interposed between the first gaps and the second gaps, and the first gaseous medium may be the same as the second gaseous medium.

The first conductive lines may be separated from each other by second gaps containing a second gaseous medium, the second gaps may be adjacent to an uppermost portion of the first conductive lines, and the first molding layer may extend from the upper surface of the first conductive lines onto upper sidewalls of the first conductive lines such that the first molding layer defines the upper surface of the first gaps and a lower surface of the second gaps.

BRIEF DESCRIPTION OF THE DRAWINGS

Example embodiments of the inventive concepts will become more apparent in view of the attached drawings and accompanying detailed description.

DETAILED DESCRIPTION OF THE EXAMPLE EMBODIMENTS

Figure 1:
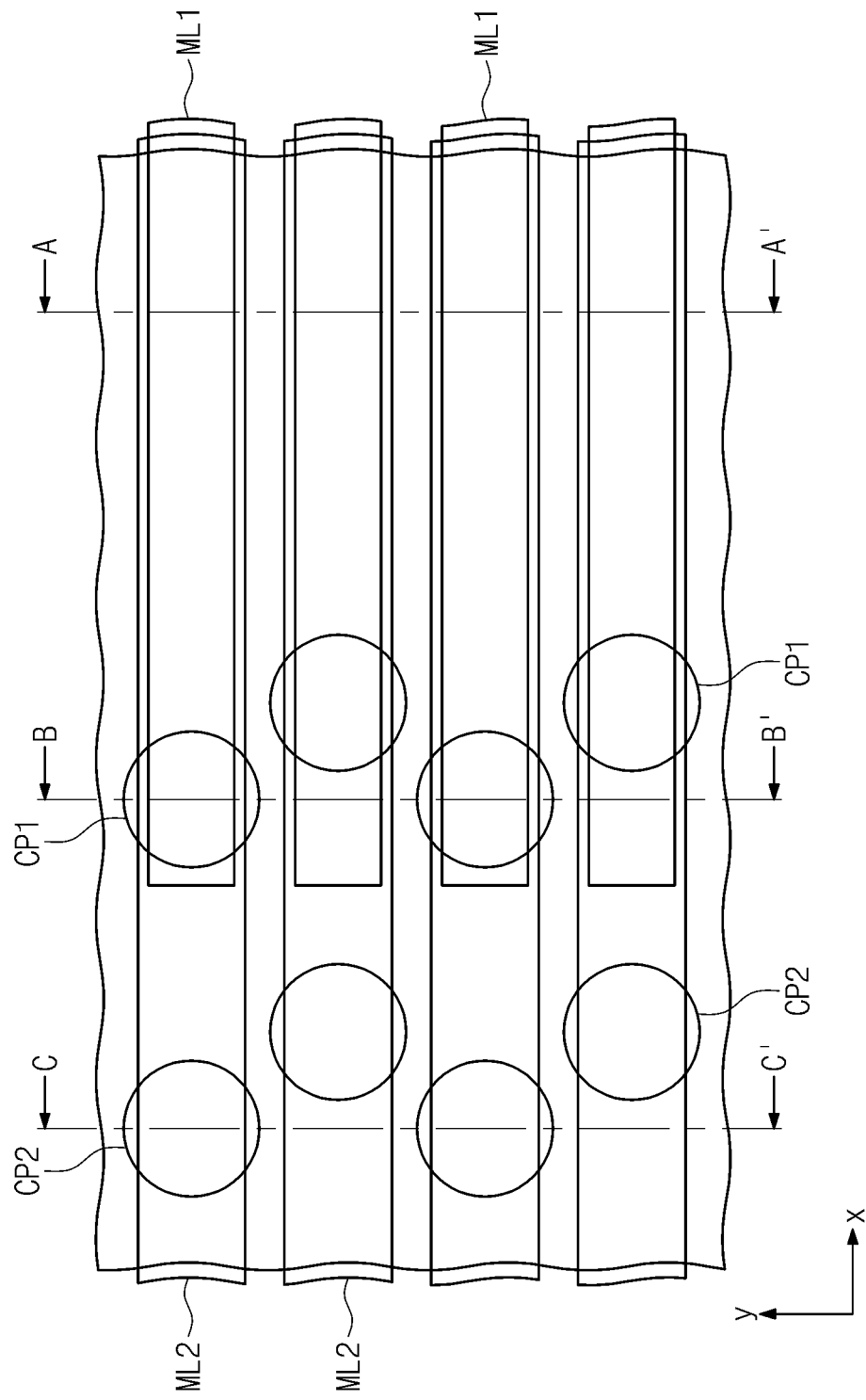
FIG. 1 is a plan view illustrating a semiconductor device according to an example embodiment of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, a semiconductor device according to example embodiments will be described with reference to the drawings.

Figure 2A:
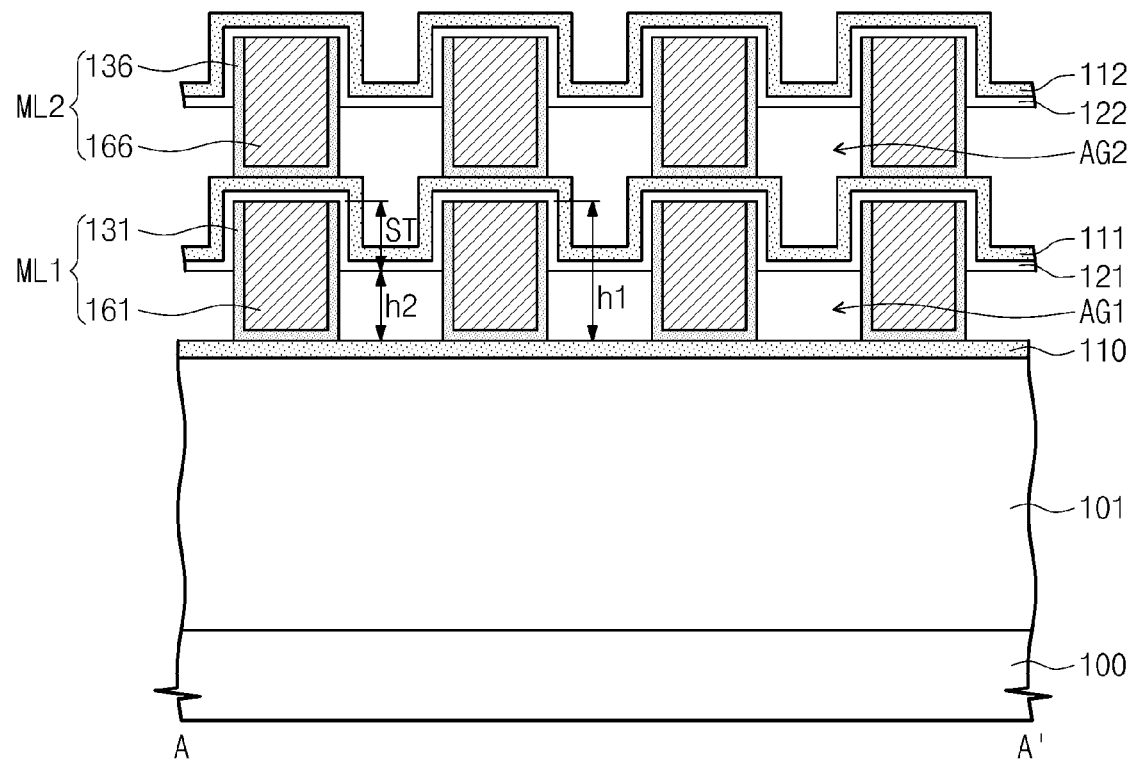
FIGS. 2A, 2B, and 2C are cross-sectional views taken along lines A-A', B-B' and C-C' of FIG. 1, respectively.
Figure 2B:
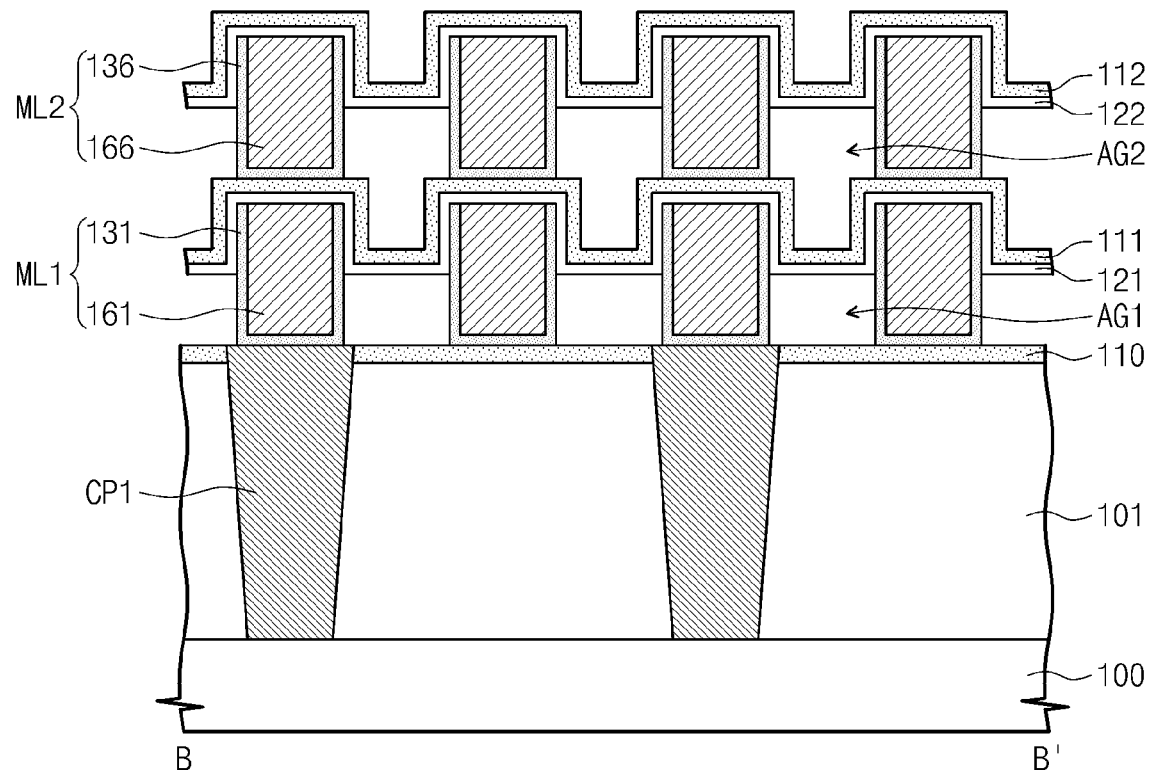
Figure 2C:
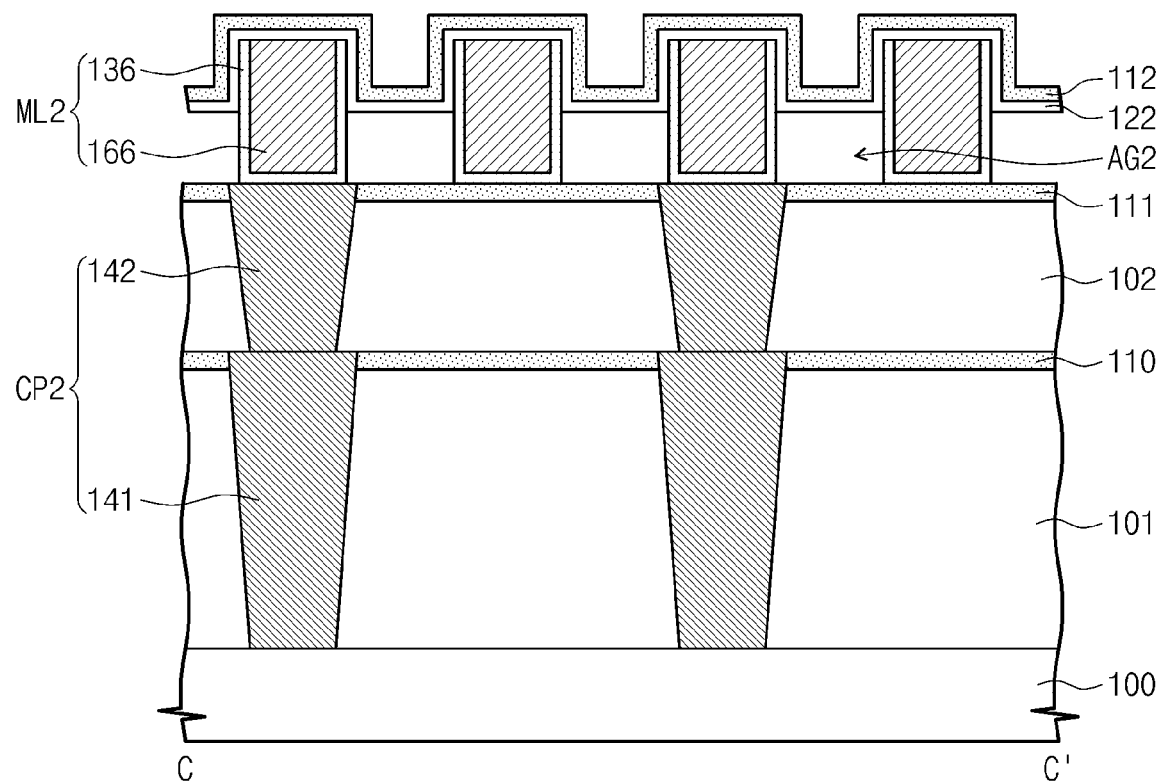

FIG. 1 is a plan view illustrating a semiconductor device according to an example embodiment of the inventive concepts. FIGS. 2A, 2B, and 2C are cross-sectional views taken along lines A-A', B-B', C-C' of FIG. 1, respectively.

Referring to FIGS. 1, 2A, 2B, and 2C, a first interlayer insulating layer 101 and a second interlayer insulating layer 102 may be sequentially disposed on a substrate 100. The substrate 100 may be a semiconductor substrate. For example, the substrate 100 may be a silicon substrate, a germanium substrate, or a silicon-germanium substrate. The substrate 100 may be a substrate on which transistors and/or memory cells are formed.

First conductive lines ML1 may be disposed on the first interlayer insulating layer 101. The first conductive lines ML1 may be electrically connected to the substrate 100 through first conductive pillars CP1 penetrating the first interlayer insulating layer 101 and an etch stop layer 110 disposed on the first interlayer insulating layer 101. In some example embodiments, the first conductive lines ML1 may be electrically connected to the transistors and/or the memory cells of the substrate 100 through the first conductive pillars CP1.

Second conductive lines ML2 may be provided on the first conductive lines ML1. The second conductive lines ML2 may be insulated from the first conductive lines ML1 by a first capping layer 111. The second conductive lines ML2 may be electrically connected to the substrate 100 through second conductive pillars CP2 penetrating the first and second interlayer insulating layers 101 and 102, the etch stop layer 110 and the first capping layer 111. Each of the second conductive pillars CP2 may include a first portion 141 penetrating the etch stop layer 110 and the first interlayer insulating layer 101 and a second portion 142 penetrating the first capping layer 111 and the second interlayer insulating layer 102. The first conductive pillars CP1 may be arranged in a zigzag form along a y-direction in a plan view. The second conductive pillars CP2 may also be arranged in a zigzag form along a y-direction in a plan view. However, example embodiments of the inventive concepts are not limited thereto. The arrangement of the first and second conductive pillars CP1 and CP2 may be changed depending on structures and arrangement of the transistors and/or memory cells formed on the substrate 100.

The first conductive lines ML1 may include first metal patterns 161 and first barrier patterns 131 provided along sidewalls and bottom surfaces of the first metal patterns 161. The first barrier patterns 131 may not cover top surfaces of the first metal patterns 161. The second conductive lines ML2 may include second metal patterns 166 and second barrier patterns 136 provided along sidewalls and bottom surfaces of the second metal patterns 166. The second barrier patterns 136 may not cover top surfaces of the second metal patterns 166. For example, the first and second metal patterns 161 and 166 may include copper (Cu) and/or aluminum (Al). The first conductive lines ML1 and the second conductive lines ML2 may be parallel to each other in FIG. 1. However, example embodiments of the inventive concepts are not limited thereto. Extending directions of the first and second conductive lines ML1 and ML2 may be changed depending on the structures and arrangement of the transistors and/or memory cells formed on the substrate 100. The first and second barrier patterns 131 and 136 may include a conductive metal nitride. For example, the first and second barrier patterns 131 and 136 may include at least one of titanium nitride (TiN), tungsten nitride (WN), and tantalum nitride (TaN). For example, the first and second conductive pillars CP1 and CP2 may include at least one of a doped semiconductor (e.g., doped silicon), a metal (e.g., tungsten), a conductive metal nitride (e.g., titanium nitride or tantalum nitride), a transition metal (e.g., titanium or tantalum), and a conductive metal-semiconductor compound (e.g., a metal silicide).

Each of the first and second interlayer insulating layers 101 and 102 may include a silicon oxide layer. The etch stop layer 110 may include a material having an etch selectivity with respect to the first and second interlayer insulating layers 101 and 102. For example, the etch stop layer 110 may include a silicon nitride layer, a silicon oxynitride layer, and/or a silicon-carbon nitride (SiCN) layer.

First air gaps AG1 may be provided between the first conductive lines ML1. Hereinafter, an air gap means a substantially empty region in which a solid phase material is not provided. The first air gaps AG1 may be covered by a first molding layer 121 extending from between the first capping layer 111 and the first conductive lines ML1 into a region between the first conductive lines ML1. Each of the first air gaps AG1 may be a region defined by sidewalls of the first conductive lines ML1 adjacent to each other, a bottom surface of the first molding layer 121 and a top surface of the etch stop layer 110.

The first molding layer 121 and the first capping layer 111 may extend between the first conductive lines ML1. In other words, the first mold layer 121 may extend from the top surfaces of the first conductive lines ML1 onto the sidewalls of the first conductive lines ML1. As a result, a height difference ST may occur between the bottom surface of the first molding layer 121 and the top surfaces of the first conductive lines ML1. A height h2 of the first air gap AG1 defined by the first molding layer 121 may be less than a height h1 of the first wire ML1. In some embodiments, the height difference ST may have a range of about 20% to about 80% of the height h1 of the first wire ML1.

A second molding layer 122 and a second capping layer 112 may be sequentially provided on the second conductive lines ML2. The second molding layer 122 and the second capping layer 112 may extend between the second conductive lines ML2. In other words, the second molding layer 122 may extend from top surfaces of the second conductive lines ML2 onto sidewalls of the second conductive lines ML2. As a result, a height difference may occur between a bottom surface of the second molding layer 122 and top surfaces of the second conductive lines ML2.

Second air gaps AG2 may be provided between the second conductive lines ML2. The second air gaps AG2 may extend from between the second conductive lines ML2 into regions between the first conductive lines ML1. Each of the second air gaps AG2 may be a region defined by the bottom surface of the second molding layer 122, sidewalls of the second conductive lines ML2, and a top surface of the first molding layer 121. In more detail, a lower part of the second air gap AG2 may be defined by the first capping layer 111 disposed on the first molding layer 121.

For example, the first and second molding layers 121 and 122 may include silicon oxide layers, respectively. Each of the first and second capping layers 111 and 112 may include at least one of a silicon nitride layer, a silicon oxynitride layer, and a silicon-carbon nitride (SiCN) layer.

For the purpose of ease and convenience in explanation, two floors of conductive lines are illustrated in the example embodiments of the inventive concepts. However, example embodiments of the inventive concepts are not limited thereto. Example embodiments of the inventive concepts may be applied to three or more floors of conductive lines. In this case, air gaps between the conductive lines disposed at a level equal to or higher than that of a third floor may have similar shapes as the second air gaps AG2.

As an integration density of a semiconductor device increases, a distance between conductive lines may be reduced and a RC delay may be increased by interference between the conductive lines. If an air gap is formed between the conductive lines, the interference phenomenon may be reduced by the air gap having a dielectric constant lower than those of general insulating layers. However, as the distance between the conductive lines further increases, a metal material may be diffused through an insulating layer into the air gap between the conductive lines. Particularly, an electric field caused by a current flowing through the conductive lines may be concentrated at upper portions of the conductive lines to increase the diffusion of the metal material.

According to a yet further example embodiment, the gap between the conductive lines may contain a gaseous medium, other than or in addition to air, that has a dielectric constant lower than those of general insulating layers. For example, the gaseous medium may have a dielectric constant lower than silicon oxide.

Figure 2D:
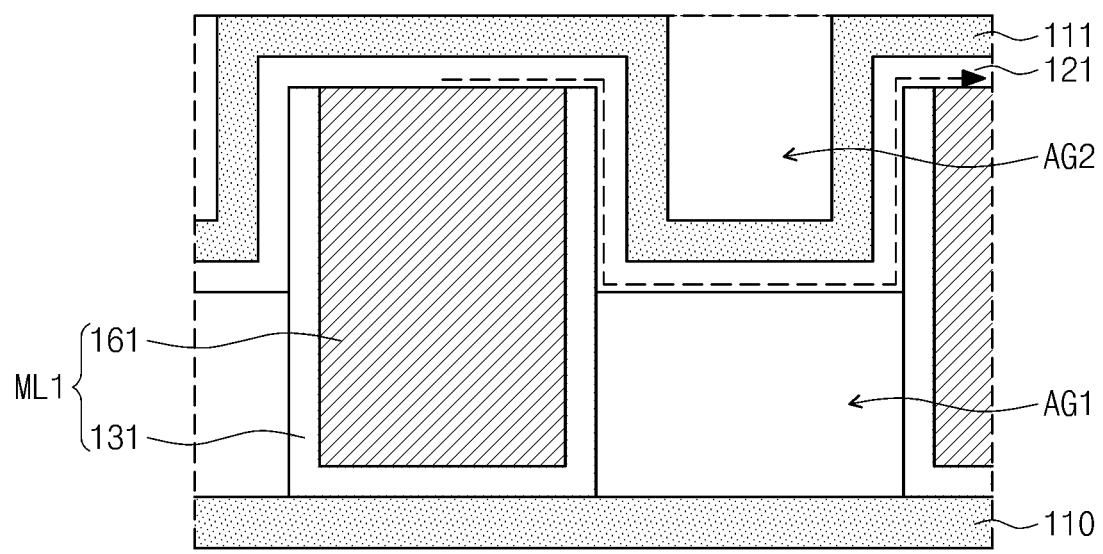
FIG. 2D is an enlarged view of first conductive lines and an air gap according to the example embodiment of the inventive concepts shown in FIG. 1.

FIG. 2D is an enlarged view of first conductive lines and an air gap according to the example embodiment of the inventive concepts shown in FIG. 1.

According to an example embodiment of the inventive concepts, the first molding layer 121 may extend from the top surfaces of the first conductive lines ML1 onto upper sidewalls of the first conductive lines ML1. Thus, it is possible to increase a diffusion distance of metal atoms diffused from one first metal pattern 161 to another first metal pattern 161 adjacent thereto. In FIG. 2D, an arrow indicates the diffusion distance of the metal atoms. As the diffusion distance of the metal atoms increases, a time dependent dielectric breakdown (TDDB) phenomenon of the semiconductor device may be reduced or relieved. Additionally, the first air gap AG1 is provided in a lower part of a region between the first metal patterns 161 and the second air gap AG2 is provided in an upper part of the region between the first metal patterns 161 in the example embodiments of the inventive concepts. Thus, interference between the first metal patterns 161 may be further reduced.

FIGS. 3 to 10 are cross-sectional views illustrating a method of fabricating a semiconductor device according to an example embodiment of the inventive concepts. FIGS. 3 to 10 are cross-sectional views taken along a line A-A' of FIG. 1.

Figure 3:
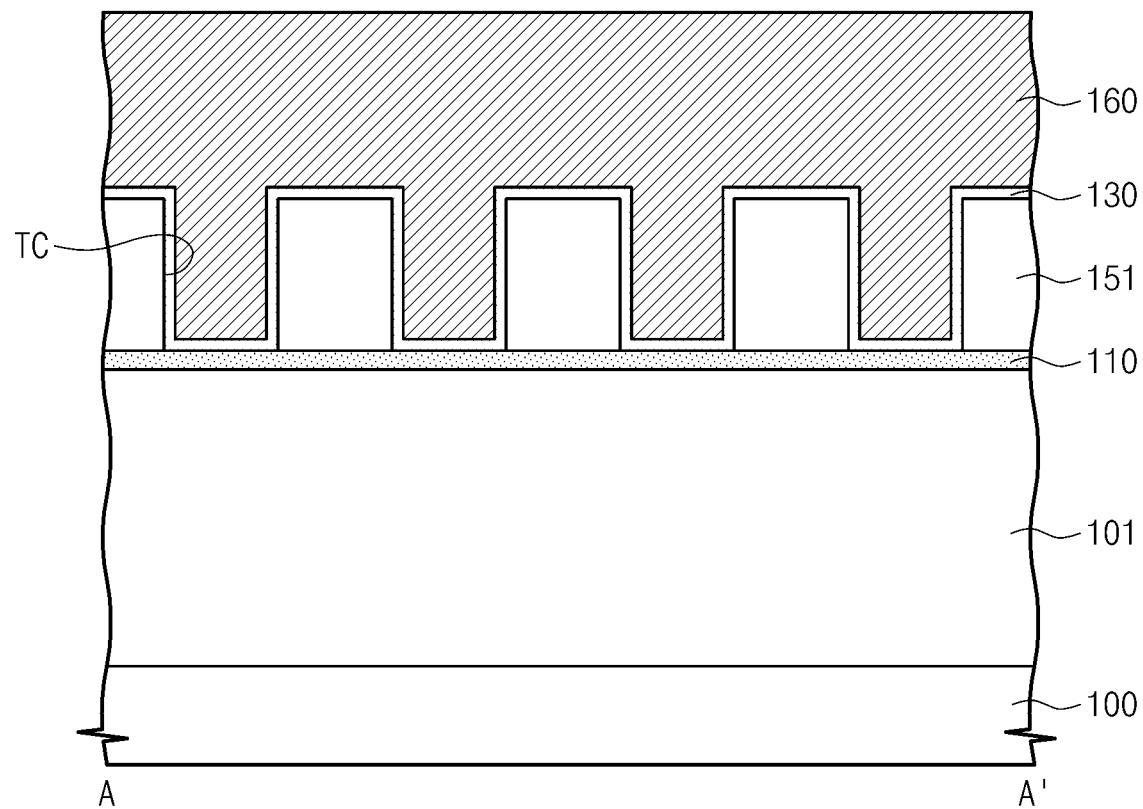
FIGS. 3 to 10 are cross-sectional views illustrating a method of fabricating a semiconductor device according to an example embodiment of the inventive concepts.

Referring to FIGS. 1 and 3, a first interlayer insulating layer 101 and an etch stop layer 110 may be sequentially provided on a substrate 100. The substrate 100 may be a substrate on which transistors and/or memory cells are formed. The first interlayer insulating layer 101 may be a dielectric layer in which conductive pillars are formed, as described with reference to FIGS. 2B and 2C. For example, the first interlayer insulating layer 101 may include a silicon oxide layer. The etch stop layer 110 may include a material having an etch selectivity with respect to the first interlayer insulating layer 101. For example, the etch stop layer 110 may include at least one of a silicon nitride layer, a silicon oxynitride, and a silicon-carbon nitride (SiCN) layer. Each of the first interlayer insulating layer 101 and the etch stop layer 110 may be formed by a chemical vapor deposition (CVD) process.

First insulating patterns 151 may be provided on the etch stop layer 110. The first insulating patterns 151 may include $SiO_2$ or SiOCH. The SiOCH may be porous. The first insulating patterns 151 may be separated from each other by trenches TC extending in the x-direction of FIG. 1.

A first barrier layer 130 and a first metal layer 160 may be sequentially formed on the first insulating patterns 151. The first barrier layer 130 may be conformally formed along sidewalls and top surfaces of the first insulating patterns 151. The first metal layer 160 may be provided on the first barrier layer 130 and may fill the trenches TC. The first barrier layer 130 may include at least one of titanium nitride (TiN), tungsten nitride (WN), and tantalum nitride (TaN). The first metal layer 160 may include copper (Cu) and/or aluminum (Al). In some example embodiments, each of the first barrier layer 130 and the first metal layer 160 may be formed by a sputtering process.

Figure 4:
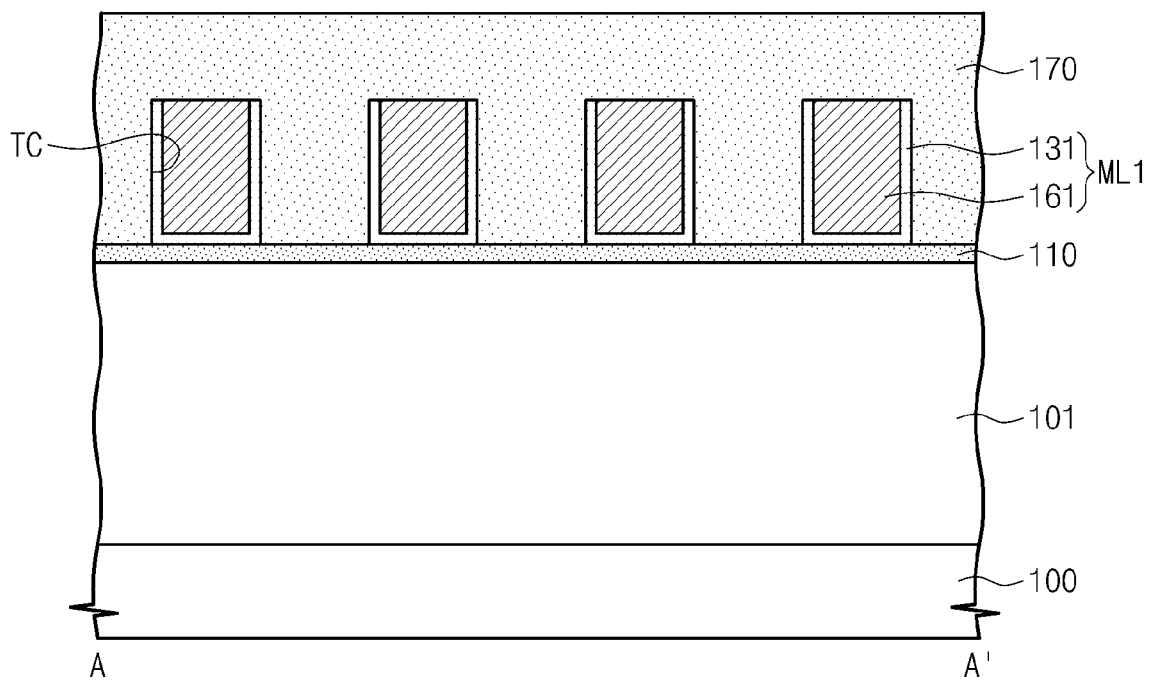

Referring to FIGS. 1 and 4, a planarization process may be performed to form first conductive lines ML1 confined in the trenches TC from the first barrier layer 130 and the first metal layer 160. Each of the first conductive lines ML1 may include a first metal pattern 161 and a first barrier pattern 131. The planarization process may include a chemical mechanical polishing (CMP) process. Thereafter, the first insulating patterns 151 may be removed. The removal process of the first insulating patterns 151 may include a plasma etching process.

A first sacrificial layer 170 may be formed on the resultant structure obtained by the removal of the first insulating patterns 151. The first sacrificial layer 170 may fill regions between the first conductive lines ML1. The first sacrificial layer 170 may include carbon. For example, the first sacrificial layer 170 may be a silicon organic hybrid (SOH) layer. The first sacrificial layer 170 may be formed by a CVD process.

Figure 5:
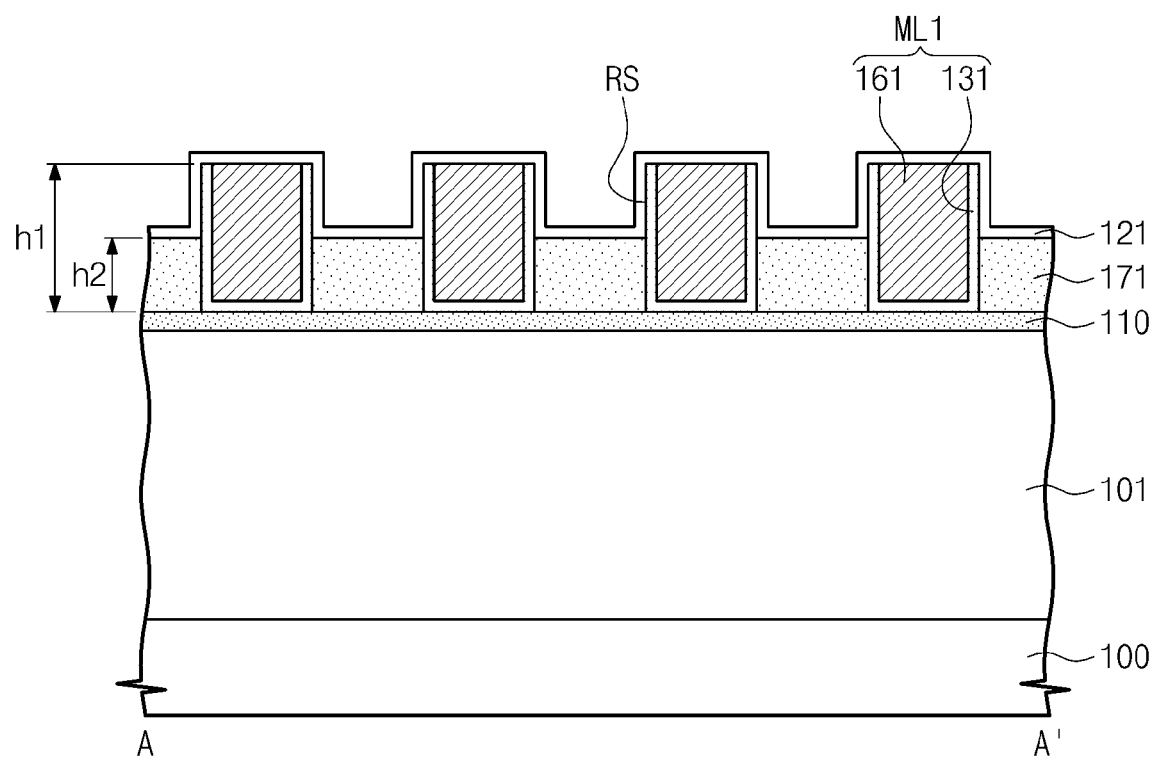

Referring to FIGS. 1 and 5, an upper portion of the first sacrificial layer 170 may be etched to form first sacrificial patterns 171 of which top surfaces are lower than top surfaces of the first conductive lines ML1. For example, the firs sacrificial layer 170 may be etched by an etch-back process. A height h2 of the first sacrificial pattern 171 may be within a range of about 20% to about 80% of a height h1 of the first wire ML1. Recess regions RS may be formed by the etching process performed on the sacrificial layer 170. The recess regions RS may be defined by sidewalls of the first conductive lines ML1 and the top surfaces of the first sacrificial patterns 171.

A first molding layer 121 may be formed to cover the first conductive lines ML1 and the first sacrificial patterns 171. The first molding layer 121 may extend along upper sidewalls of the first conductive lines ML1 defining the recess regions RS. The first molding layer 121 may be conformally formed along bottom surfaces and sidewalls of the recess regions RS.

For example, the first molding layer 121 may include at least one of $SiO_2$, SiOCH, SiOC, and SiON. The first molding layer 121 may include a porous material. The first molding layer 121 may be formed by an atomic layer deposition (ALD) process. A thickness of the first molding layer 121 may be less than the height h1 of the first wire ML1. For example, the thickness of the first molding layer 121 may be substantially equal to or less than one-third (⅓) of the height h1 of the first wire ML1.

Figure 6:
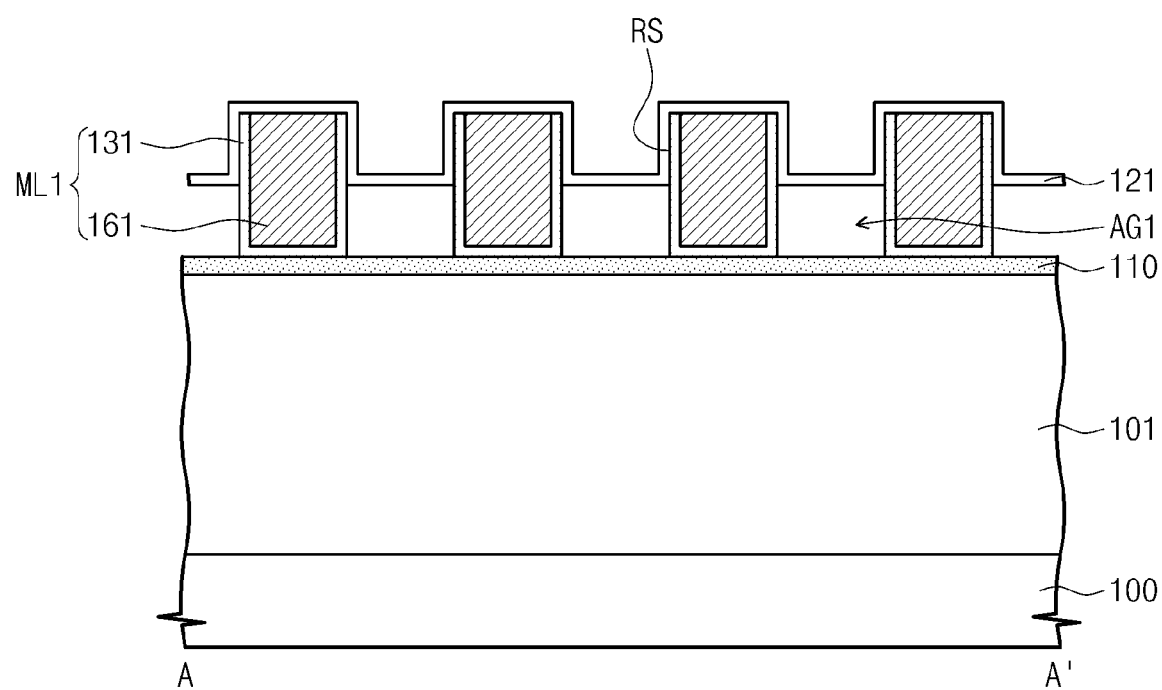

Referring to FIGS. 1 and 6, the first sacrificial patterns 171 under the first molding layer 121 may be removed to form first air gaps AG1. The removal process of the first sacrificial patterns 171 may include an ashing process and/or an ultraviolet irradiating process. Because the first molding layer 121 has a relatively thin thickness, by-products caused by the ashing process and/or the ultraviolet irradiating process may pass through the first molding layer 121 and then may be exhausted.

Figure 7:
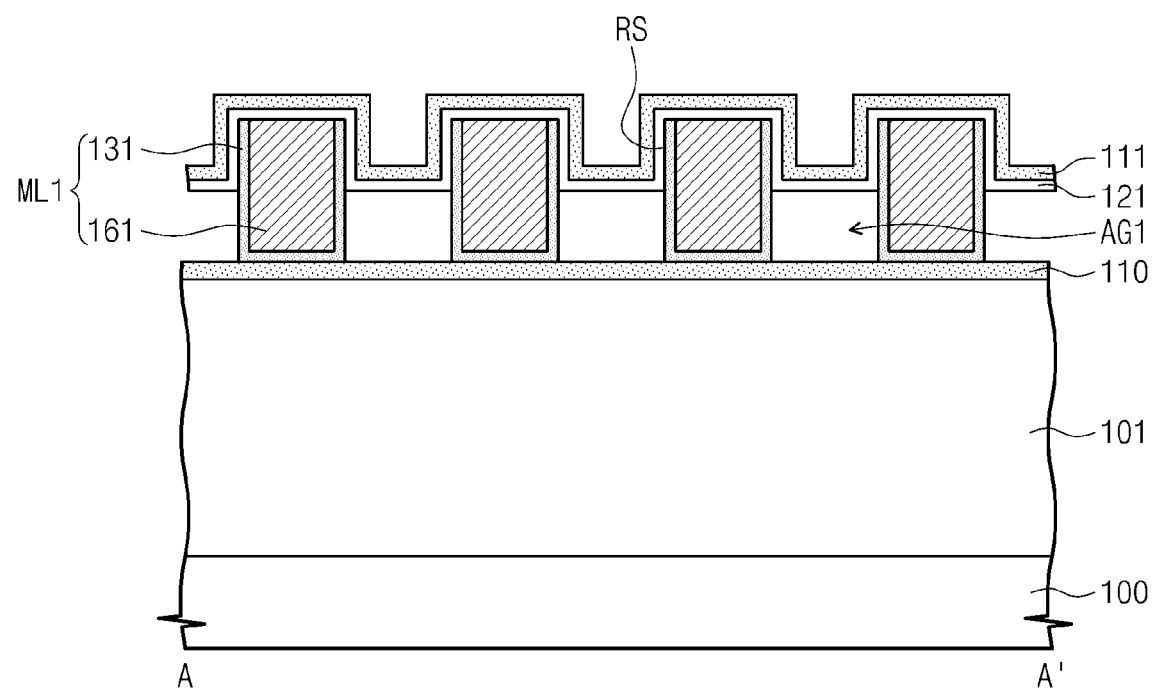

Referring to FIGS. 1 and 7, a first capping layer 111 may be formed on the first molding layer 121. The first capping layer 111 may be conformally formed along the first molding layer 121. The recess regions RS may not be completely filled with the first molding layer 121 and the first capping layer 111. The first capping layer 111 may include at least one of a silicon nitride layer, a silicon oxynitride layer, and a silicon-carbon nitride (SiCN) layer. In some example embodiments, the first capping layer 111 may be formed by a CVD process.

Figure 8:
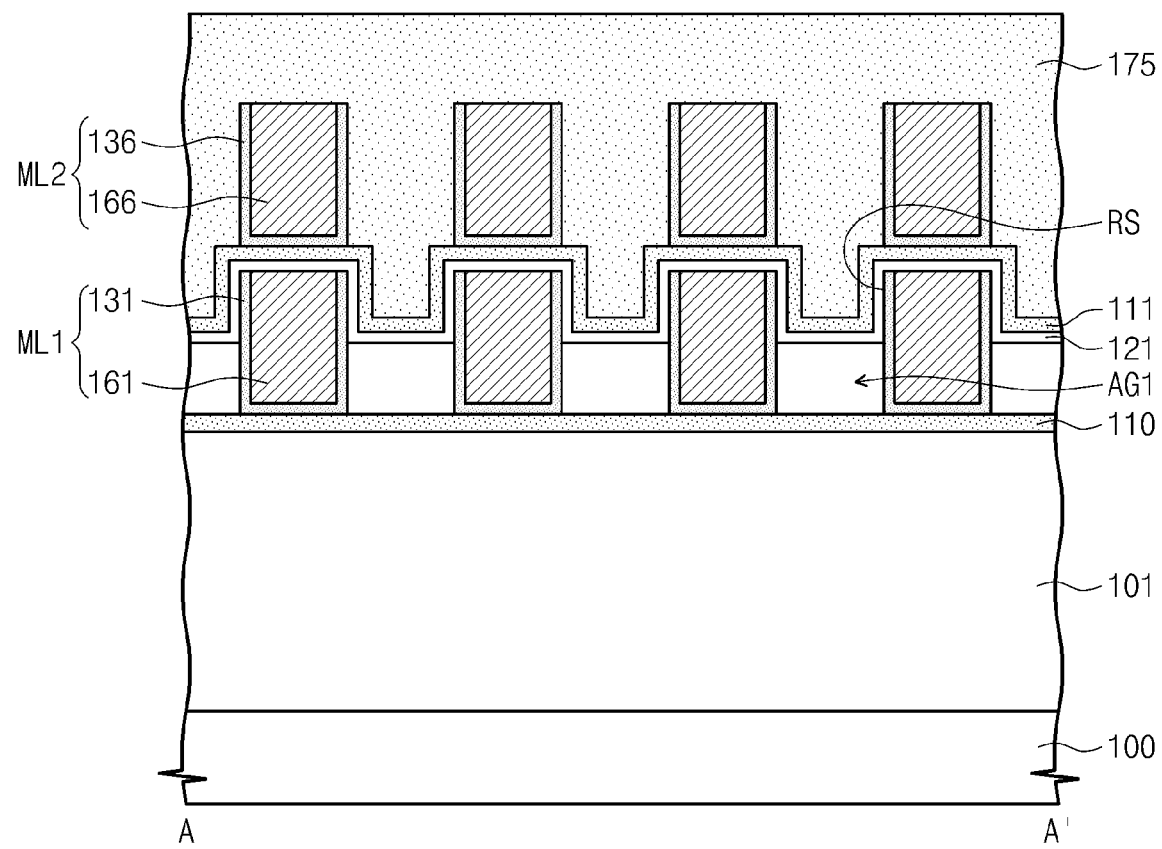

Referring to FIGS. 1 and 8, second conductive lines ML2 may be formed on the first capping layer 111. A forming method of the second conductive lines ML2 may be the same as the forming method of the first conductive lines described with reference to FIGS. 3 and 4. A second sacrificial layer 175 may be formed to cover the second conductive lines ML2. The second sacrificial layer 175 may extend into the recess regions RS. The second sacrificial layer 175 may be formed of the same material as the first sacrificial layer 170 of FIG. 4.

Figure 9:
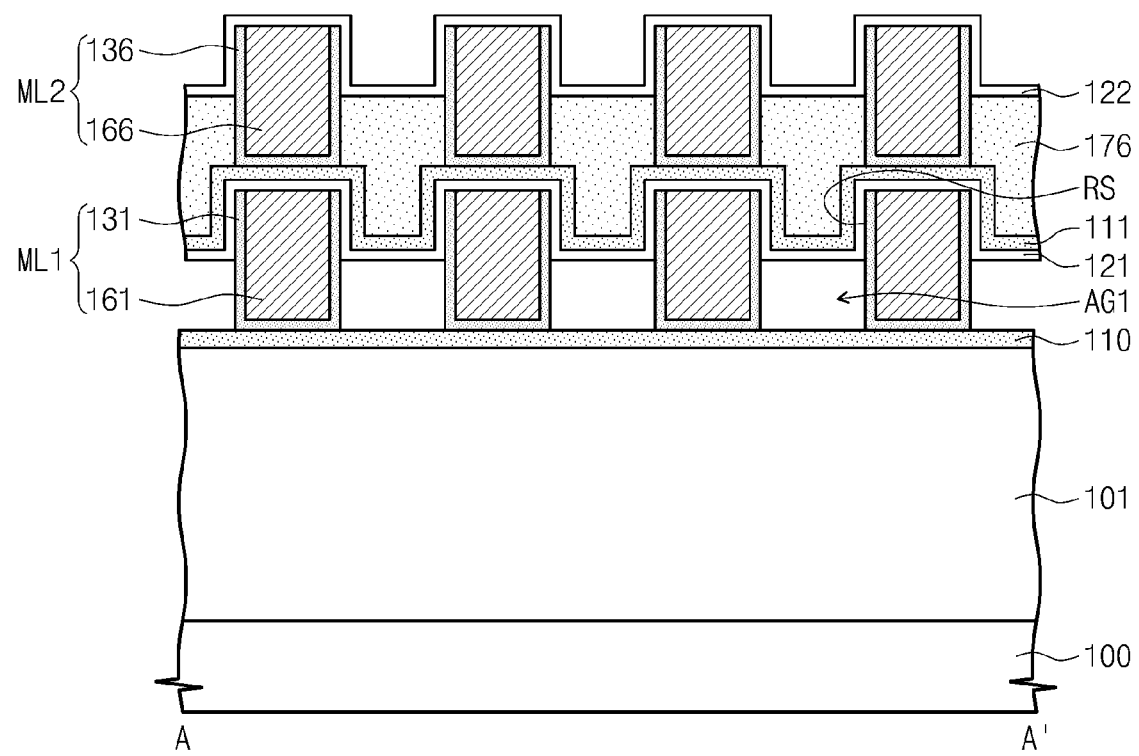

Referring to FIGS. 1 and 9, an upper portion of the second sacrificial layer 175 may be etched to form second sacrificial patterns 176 of which top surfaces are lower than top surfaces of the second conductive lines ML2. For example, the etching process of the second sacrificial layer 175 may include an etch-back process. An upper portion of each of the second sacrificial patterns 176 may be formed between the second conductive lines ML2, and a lower portion of each of the second sacrificial patterns 176 may extend into each of the recess regions RS. A second molding layer 122 may be formed to cover the second sacrificial patterns 176 and the second conductive lines ML2. The second molding layer 122 may be formed of the same material as the first molding layer 121. Additionally, the second molding layer 122 may be formed by the same method as the first molding layer 121.

Figure 10:
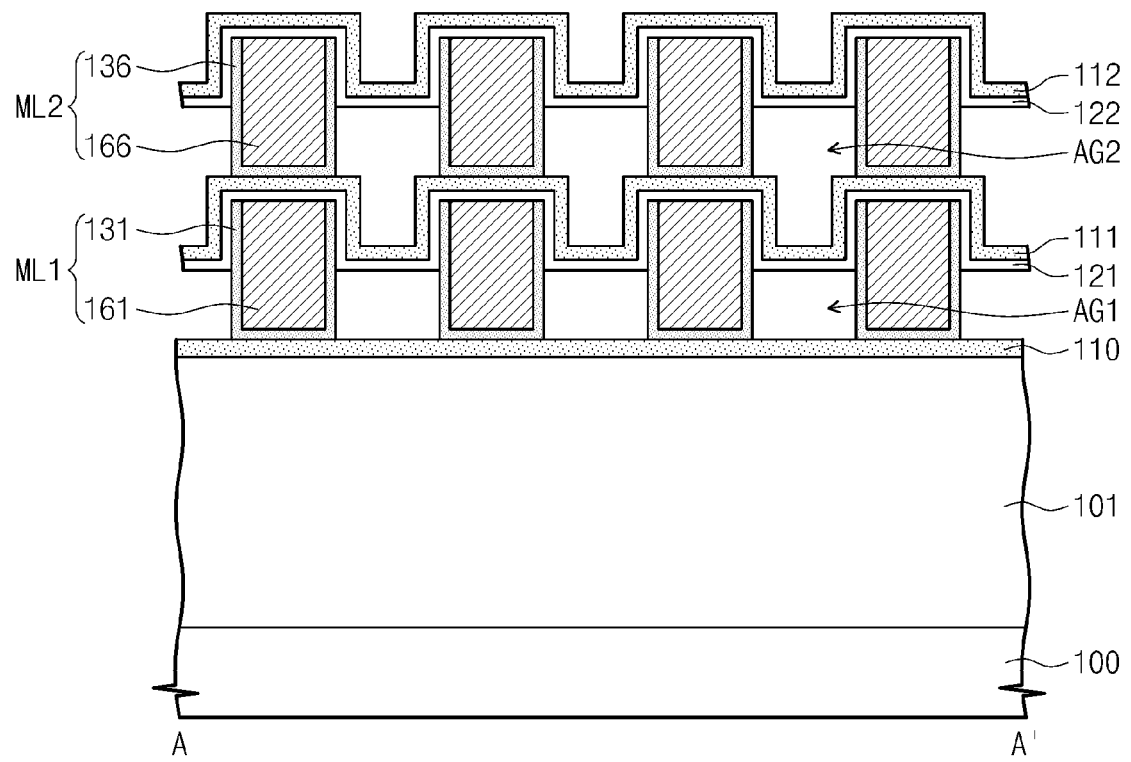

Referring to FIGS. 1 and 10, the second sacrificial patterns 176 disposed under the second molding layer 122 may be removed to form second air gaps AG2. The removal process of the second sacrificial patterns 176 may include an ashing process and/or an ultraviolet irradiating process. Because the second molding layer 122 has a relatively thin thickness, by-products generated by the ashing process and/or the ultraviolet irradiating process may pass through the second molding layer 122 and then may be exhausted.

For the purpose of ease and convenience in explanation, two floors of conductive lines are illustrated in the example embodiments of the inventive concepts. However, example embodiments of the inventive concepts are not limited thereto. Example embodiments of the inventive concepts may be applied to three or more floors of conductive lines.

According to some example embodiments of the inventive concepts, it is possible to increase the diffusion distance of metal atoms diffused from one first metal pattern 161 to another first metal pattern 161 adjacent thereto. Thus, the time dependent dielectric breakdown (TDDB) phenomenon of the semiconductor device may be reduced or relieved.

FIGS. 11 to 14 are cross-sectional views illustrating a semiconductor device and a method of fabricating the same according to another example embodiment of the inventive concepts. FIGS. 11 to 14 are cross-sectional views taken along a line A-A' of FIG. 1. In the present example embodiment, the descriptions to the same elements as described in the aforementioned embodiments will be omitted or mentioned briefly for the purpose of ease and convenience in explanation.

Figure 11:
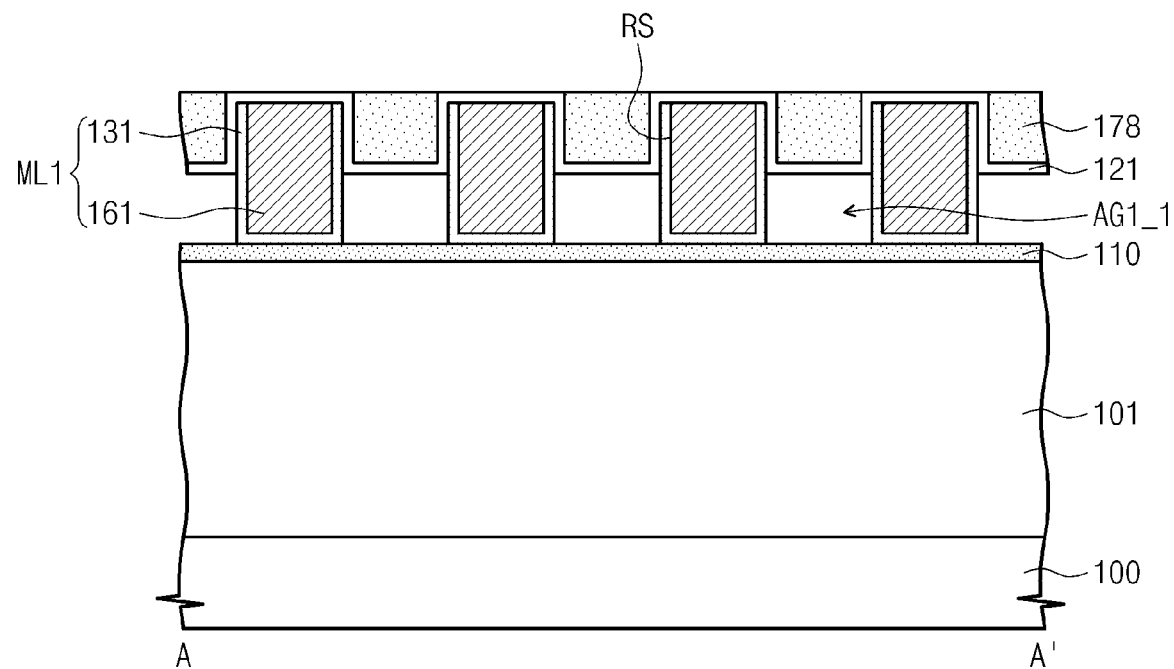
FIGS. 11 to 14 are cross-sectional views illustrating a semiconductor device and a method of fabricating the same according to another example embodiment of the inventive concepts.

Referring to FIGS. 1 and 11, third sacrificial patterns 178 filling the recess regions RS may be formed on the resultant structure described with reference to FIG. 6. In the present example embodiment, the first air gaps AG1 of FIG. 6 are defined as first gap regions AG1_1. A third sacrificial layer may be formed on the first molding layer 121 and then an etch-back process may be performed on the third sacrificial layer until the first molding layer 121 on the top surfaces of the first conductive lines ML1 is exposed. Thus, the third sacrificial patterns 178 may be formed. The third sacrificial patterns 178 may be formed of the same material as the first sacrificial patterns 171 described with reference to FIG. 5.

Figure 12:
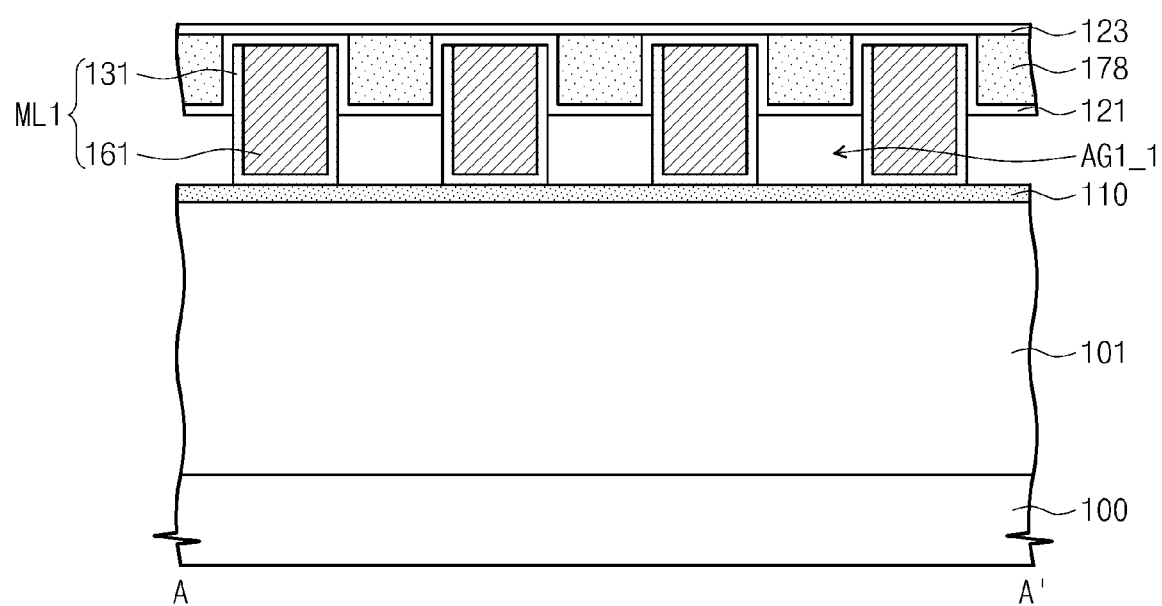

Referring to FIGS. 1 and 12, a third molding layer 123 may be formed on the third sacrificial patterns 178. The third molding layer 123 may include the same material as the first molding layer 121. The third molding layer 123 may be in contact with the first molding layer 121 on the top surfaces of the first conductive lines ML1.

Figure 13:
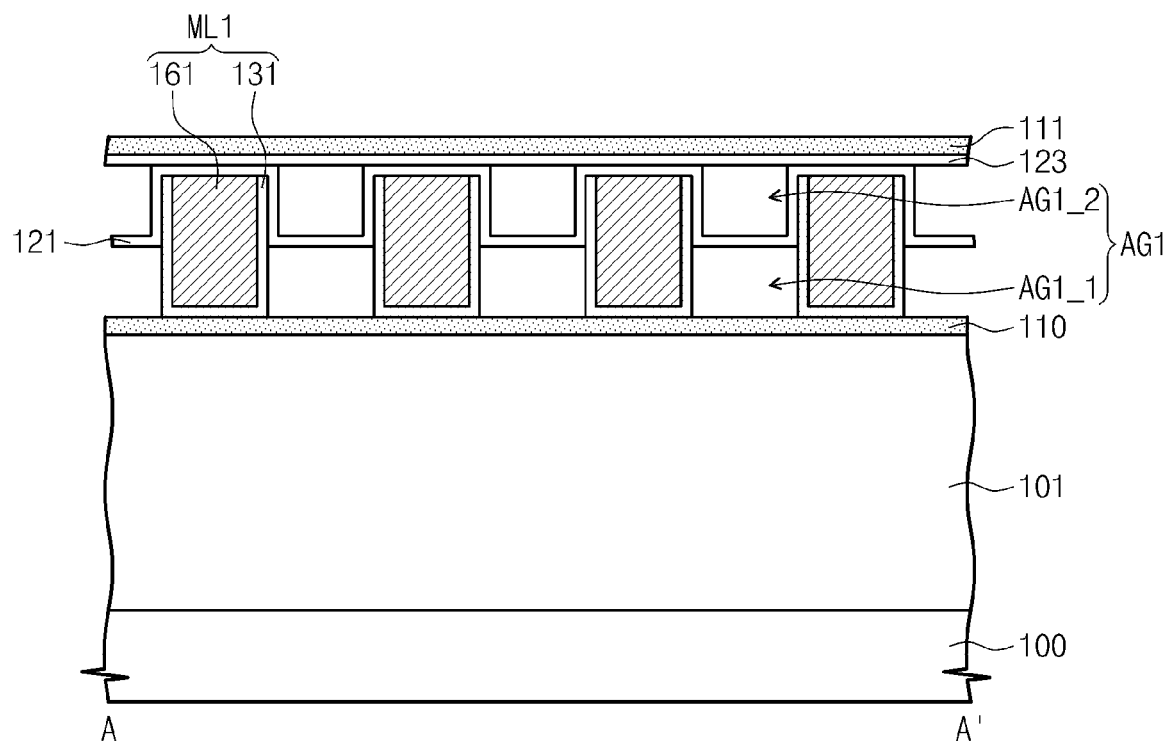

Referring to FIGS. 1 and 13, the third sacrificial patterns 178 may be removed to form second gap regions AG1_2. As a result, first air gaps AG1 may be formed. Each of the first air gaps AG1 includes the first gap region AG1_1 and the second gap region AG1_2 disposed on the first gap region AG1_1. The first and second gap regions AG1_1 and AG1_2 of each of the first air gaps AG1 may be separated from each other by the first molding layer 121. A bottom surface and a sidewall of the second gap region AG1_2 may be defined by the first molding layer 121, and a top surface of the second gap region AG1_2 may be defined by the third molding layer 123. A first capping layer 111 may be formed on the third molding layer 123.

Figure 14:
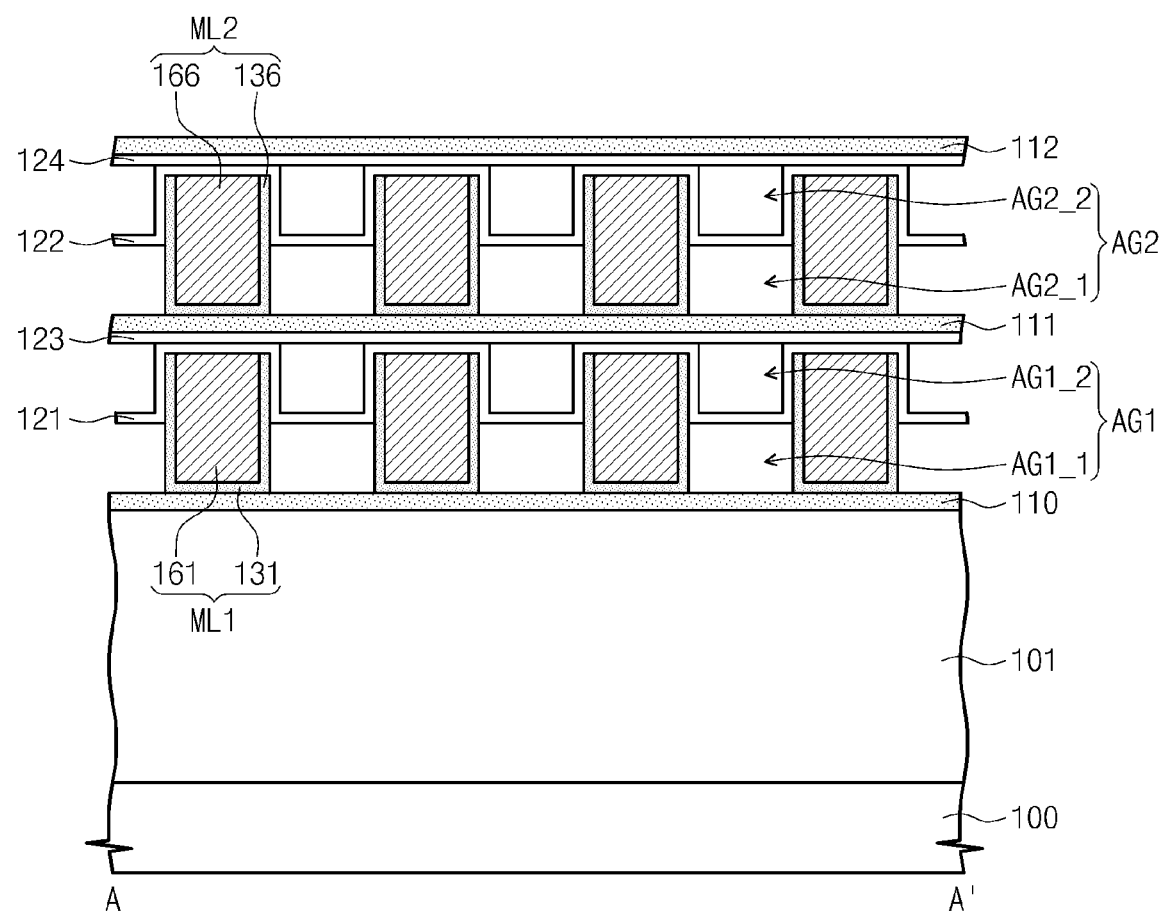

Referring to FIGS. 1 and 14, the processes described with reference to FIGS. 11 to 13 may be repeatedly performed to form second conductive lines ML2 and second air gaps AG2 between the second conductive lines ML2. The second air gaps AG2 may include first gap regions AG2_1 in lower regions between the second conductive lines ML2 and second gap regions AG2_2 in upper regions between the second conductive lines ML2. The first gap regions AG2_1 may be separated from the second gap regions AG2_2 by a second molding layer 122. A bottom surface and a sidewall of the second gap region AG2_2 may be defined by the second molding layer 122, and a top surface of the second gap region AG2_2 may be defined by a fourth molding layer 124. A second capping layer 112 may be formed on the fourth molding layer 124.

FIGS. 15 to 18 are cross-sectional views illustrating a semiconductor device and a method of fabricating the same according to a further example embodiment of the inventive concepts. FIGS. 15 to 18 are cross-sectional views taken along a line A-A' of FIG. 1. In the present example embodiment, the descriptions to the same elements as described in the aforementioned example will be omitted or mentioned briefly for the purpose of ease and convenience in explanation.

Figure 15:
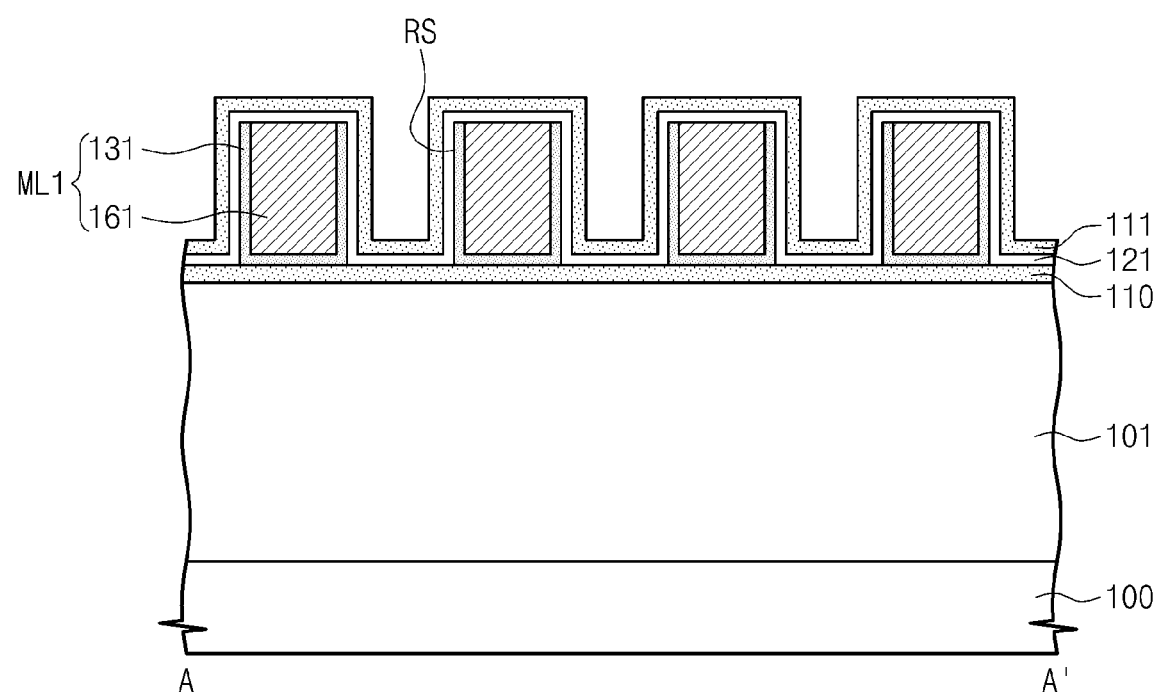
FIGS. 15 to 18 are cross-sectional views illustrating a semiconductor device and a method of fabricating the same according to a further example embodiment of the inventive concepts.

Referring to FIGS. 1 and 15, a first molding layer 121 and a first capping layer 111 may be sequentially formed on the first conductive lines ML1 described with reference to FIG. 4. Unlike FIG. 4, the formation process of the first sacrificial layer 170 may be omitted. As a result, a bottom surface of the first molding layer 121 may be in contact with the etch stop layer 110.

Figure 16:
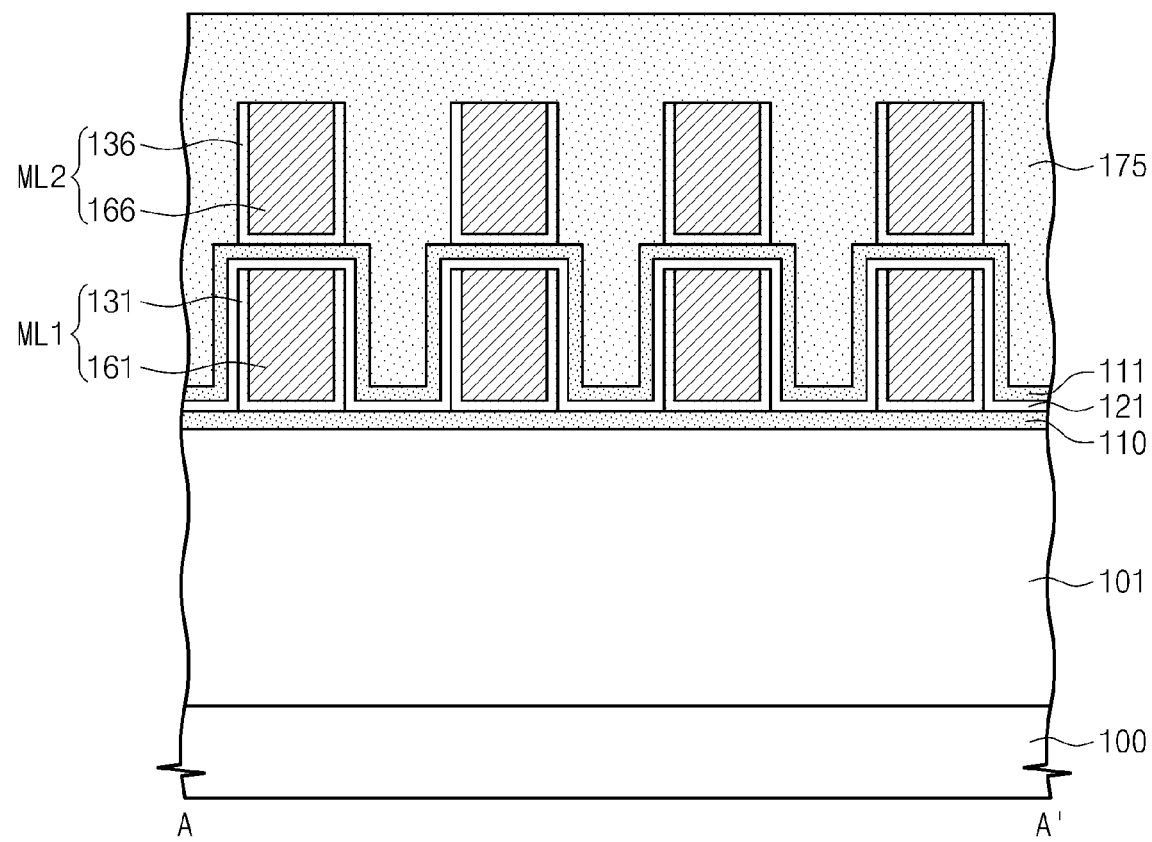

Referring to FIGS. 1 and 16, second conductive lines ML2 may be formed on the first capping layer 111. The second conductive lines ML2 may be formed by the same method as the forming method of the first conductive lines described with reference to FIGS. 3 and 4. A second sacrificial layer 175 may be formed to cover the second conductive lines ML2. The second sacrificial layer 175 may extend between the first conductive lines ML1. The second sacrificial layer 175 may be formed of the same material as the first sacrificial layer 170 of FIG. 4.

Figure 17:
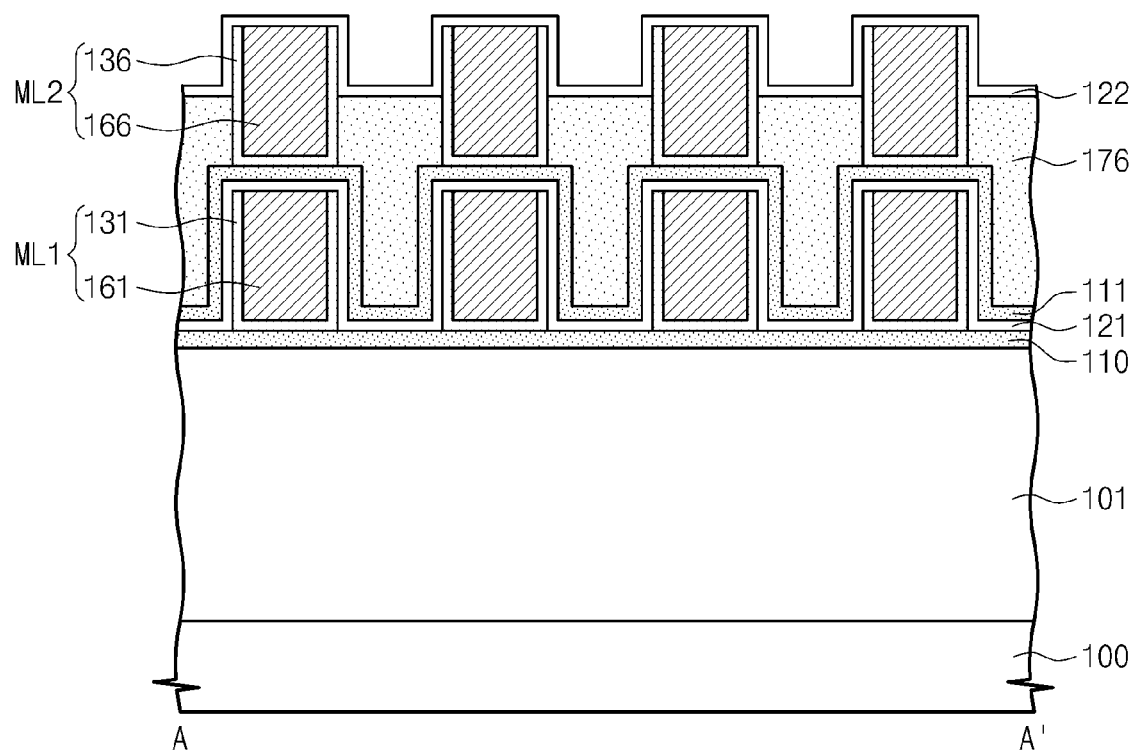

Referring to FIGS. 1 and 17, an upper portion of the second sacrificial layer 175 may be etched to form second sacrificial patterns 176 of which top surfaces are lower than top surfaces of the second conductive lines ML2. For example, the etching process of the second sacrificial layer 175 may include an etch-back process. An upper portion of each of the second sacrificial patterns 176 may be formed between the second conductive lines ML2 adjacent to each other, and a lower portion of each of the second sacrificial patterns 176 may be formed between the first conductive lines ML1 adjacent to each other. A second molding layer 122 may be formed to cover the second sacrificial patterns 176 and the second conductive lines ML2. The second molding layer 122 may be formed of the same material as the first molding layer 121. Additionally, the second molding layer 122 may be formed by the same method as the first molding layer 121.

Figure 18:
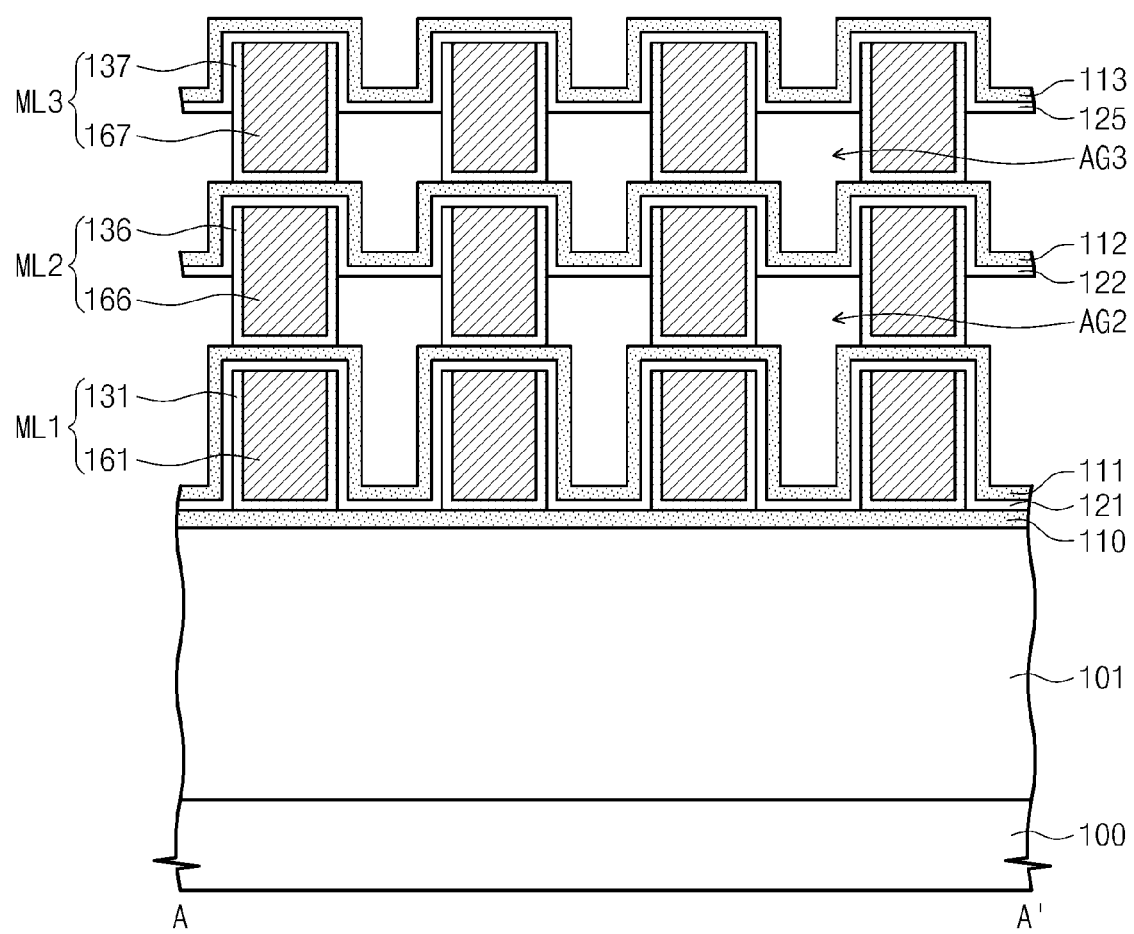

Referring to FIGS. 1 and 18, the second sacrificial patterns 176 disposed under the second molding layer 122 may be removed to form second air gaps AG2. The removal process of the second sacrificial patterns 176 may include an ashing process and/or an ultraviolet irradiating process. Because the second molding layer 122 has a relatively thin thickness, by-products caused by the ashing process and/or the ultraviolet irradiating process may pass through the second molding layer 122 and then may be exhausted. A second capping layer 112 may be formed on the second molding layer 122. The second capping layer 112 may be formed of at least one of a silicon nitride layer, a silicon oxynitride layer, and/or a silicon-carbon nitride (SiCN) layer.

Third metal conductive lines ML3 may be formed on the second capping layer 112. Third air gaps AG3 may be formed between the third conductive lines ML3. The third conductive lines ML3 and the third air gaps AG3 may be formed by repeatedly performing the same processes as the formation processes of the second conductive lines ML2 and the second air gaps AG2. A fifth molding layer 125 and a third capping layer 113 may be sequentially formed on the third conductive lines ML3.

As discussed above, the gap between the conductive lines may contain a gaseous medium, other than or in addition to air, that has a dielectric constant lower than those of general insulating layers. According to an example embodiment, the first and second gaps (e.g., AG1 and AG2 shown in FIG. 10), or the first gap region and the second gap region of the gap (e.g., AG1_1 and AG1_2 of AG1 shown in FIG. 14) may contain different gaseous mediums. For example, the first gap (e.g., AG1 shown in FIG. 10, or AG1_1 shown in FIG. 14) may contain air, and the second gap (e.g., AG2 shown in FIG. 10, or AG1_2 shown in FIG. 14) may contain a gas other than air that has a dielectric constant lower than, for example, silicon oxide. According to another example embodiment, a gap may contain a mixture of gaseous mediums. For example, the first gap (e.g., AG1 shown in FIG. 10), or the first gap region of the gap (e.g., AG1_1 of AG1 shown in FIG. 14), or the second gap (e.g., AG2 shown in FIG. 18) may contain at least two different gases (e.g., air and a gas other than air that has a dielectric constant lower than, for example, silicon oxide).

Figure 19:
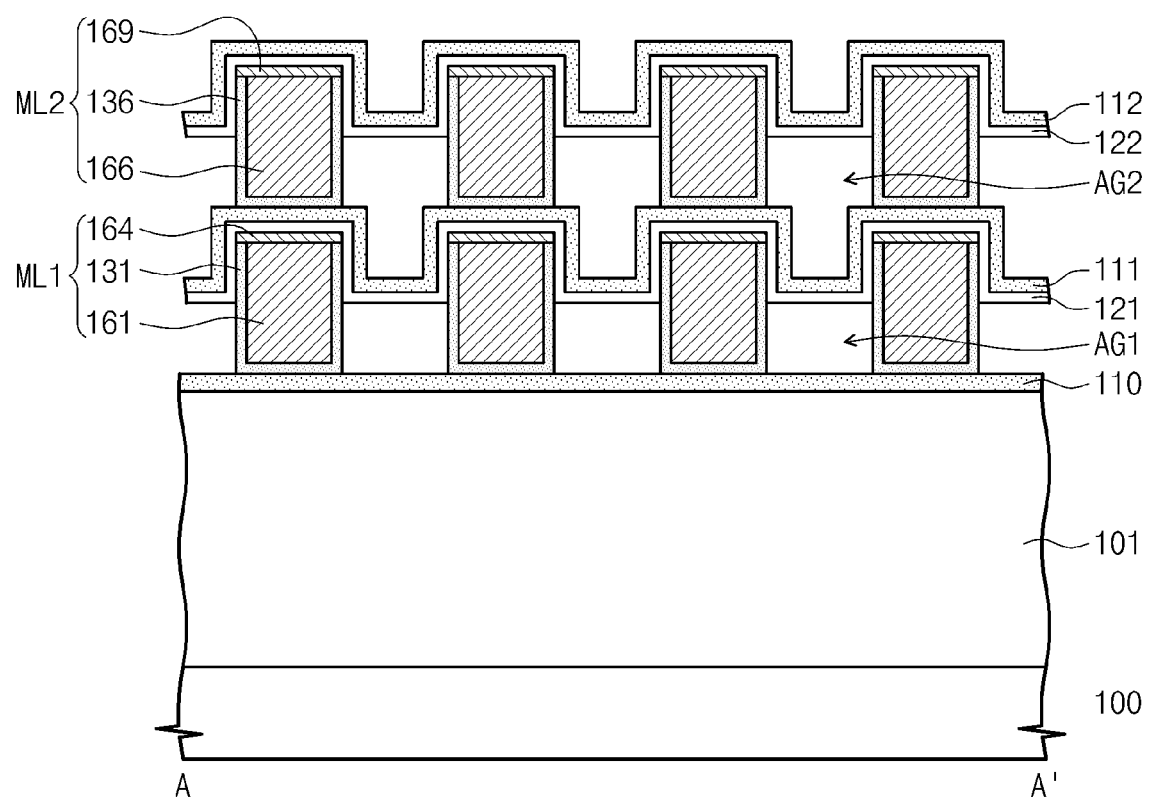
FIG. 19 is a cross-sectional view illustrating a semiconductor device and a method of fabricating the same according to yet another example embodiment of the inventive concepts.

FIG. 19 is a cross-sectional view illustrating a semiconductor device and a method of fabricating the same according to yet another example embodiment of the inventive concepts. FIG. 19 is a cross-sectional view taken along a line A-A' of FIG. 1. In the present example embodiment, the descriptions to the same elements as described in the aforementioned embodiments will be omitted or mentioned briefly for the purpose of ease and convenience in explanation.

In the present example embodiment, first conductive lines ML1 may further include first protection patterns 164 covering top surfaces of first metal patterns 161, respectively. Second conductive lines ML2 may further include second protection patterns 169 covering top surfaces of second metal patterns 166, respectively. The first protection patterns 164 may be formed by depositing or growing a metal layer on exposed top surfaces of the first metal patterns 161 before the formation of the first molding layer 121. The first protection patterns 164 may include a different metal material from the first metal patterns 161. For example, the first protection patterns 164 may include cobalt. The second protection patterns 169 may be formed of the same material as the first protection patterns 164. The second protection patterns 169 may be formed by the same method as the first protection patterns 164.

The semiconductor devices described in the aforementioned example embodiments may be encapsulated using various packaging techniques. For example, the semiconductor devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to the above example embodiments is mounted may further include at least one semiconductor device (e.g., a controller and/or a logic device) that performs at least one of other functions.

Figure 20:
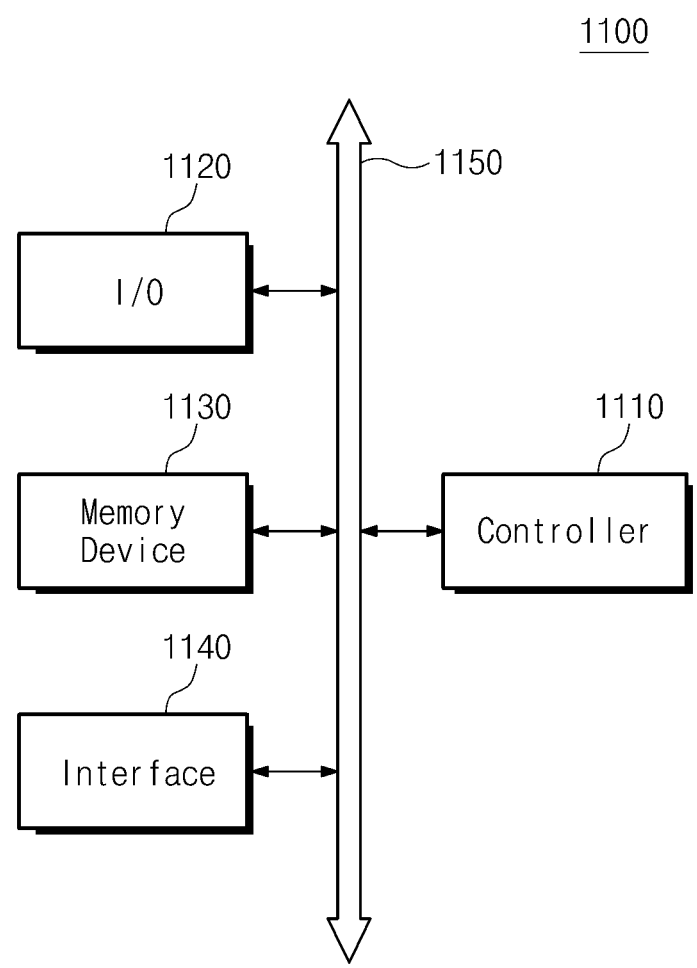
FIG. 20 is a schematic block diagram illustrating an example of electronic systems including semiconductor devices according to an example embodiment of the inventive concepts.

FIG. 20 is a schematic block diagram illustrating an example of electronic systems including semiconductor devices according to an example embodiment of the inventive concepts; and Referring to FIG. 20, an electronic system 1100 according to the present example embodiment of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and other logic devices having a similar function to any one of the microprocessor, the digital signal processor and the microcontroller. If the semiconductor devices in the aforementioned example embodiments are realized as logic devices, the controller 1110 may include at least one of the semiconductor devices in the aforementioned example embodiments. The I/O unit 1120 may include a keypad, a keyboard and/or a display unit. The memory device 1130 may store data and/or commands. The memory device 1130 may include at least one of the semiconductor devices according to the example embodiments described above. The memory device 1130 may further include another type of semiconductor memory devices which are different from the semiconductor devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 21:
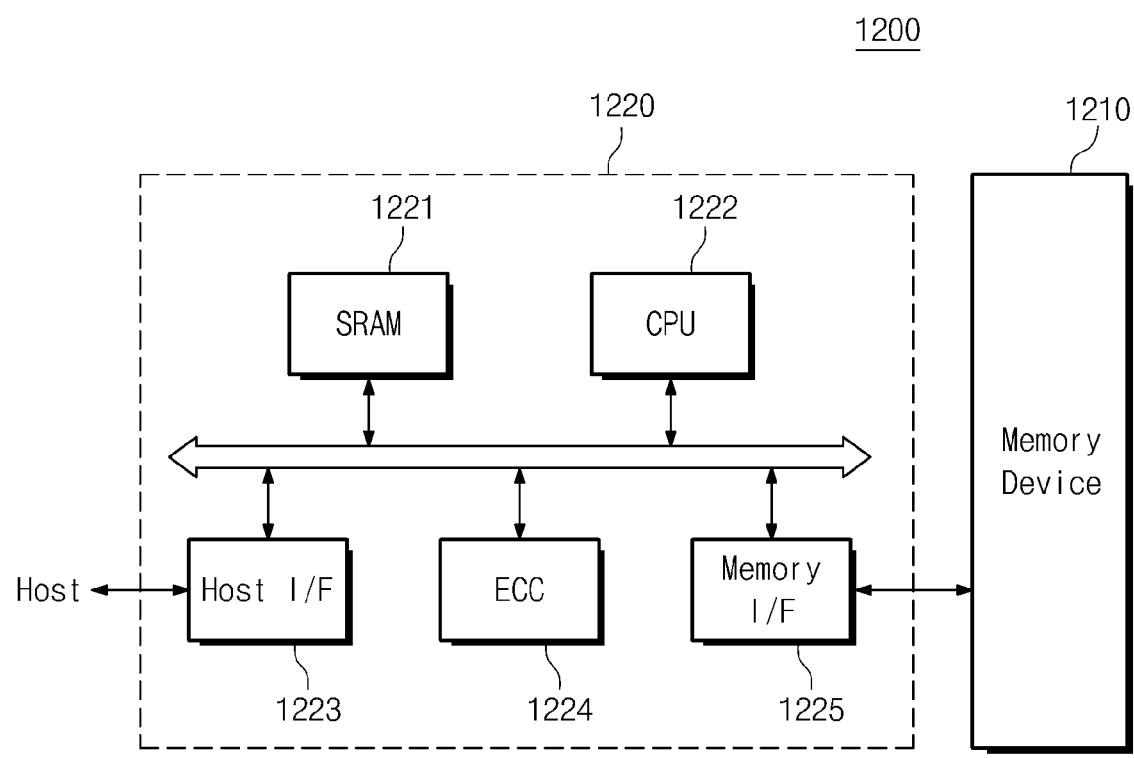
FIG. 21 is a schematic block diagram illustrating an example of memory cards including semiconductor devices according to an example embodiment of the inventive concepts.

FIG. 21 is a schematic block diagram illustrating an example of memory cards including semiconductor devices according to an example embodiment of the inventive concepts.

Referring to FIG. 21, a memory card 1200 according to the present example embodiment of the inventive concepts may include a memory device 1210. The memory device 1210 may include at least one of the semiconductor devices according to the example embodiments mentioned above. In other example embodiments, the memory device 1210 may further include another type of semiconductor memory devices which are different from the semiconductor devices according to the example embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to the aforementioned example embodiments of the inventive concepts, the semiconductor device having high reliability may be realized. Additionally, the highly integrated semiconductor device may be realized.

While the inventive concepts has been described with reference to example embodiments, it will be apparent to those skilled in the art that various changes and modifications may be made without departing from the spirit and scope of the inventive concepts. Therefore, it should be understood that the above example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device, comprising:
   first conductive lines on a substrate; and
   a first molding layer covering the first conductive lines,
   the first conductive lines having air gaps between adjacent first conductive lines,
   sidewalls of the first conductive lines and a bottom surface of the first molding layer collectively defining a first gap region of each of the air gaps, and
   the sidewalls of the first conductive lines and a top surface of the first molding layer collectively defining a second gap region of each of the air gaps.

2. The semiconductor device of claim 1, wherein
   the first molding layer extends between the first conductive lines, and
   the first gap region is separated from the second gap region by the first molding layer.

3. The semiconductor device of claim 1, further comprising:
   a capping layer on the first molding layer; and
   second conductive lines on the capping layer.

4. The semiconductor device of claim 3, wherein
the capping layer extends between the first conductive lines, and
the first gap region is separated from the second gap region by the capping layer and the first molding layer.

5. The semiconductor device of claim 3, wherein the second gap region is between the capping layer and the first molding layer.

6. The semiconductor device of claim 5, further comprising:
a second molding layer between the capping layer and the second gap region.

7. The semiconductor device of claim 3, wherein the second gap region extends between the second conductive lines.

8. The semiconductor device of claim 7, further comprising:
a second molding layer covering the second conductive lines, the second molding layer extending between the second conductive lines,
the second gap region being further defined by sidewalls of the second conductive lines and a bottom surface of the second molding layer.

9. The semiconductor device of claim 1, wherein
a height difference occurs between the bottom surface of the first molding layer and top surfaces of the first conductive lines, and
the height difference has a range of about 20% to about 80% of a height of the first conductive lines.

* * * * *